United States Patent [19]
Miura et al.

[11] Patent Number: 5,096,841
[45] Date of Patent: Mar. 17, 1992

[54] ION-IMPLANTATION METHOD IN SOLID MATERIALS FOR IMPLANTING IMPURITIES

[75] Inventors: Atsushi Miura; Akitsu Shimoda, both of Tenri, Japan

[73] Assignee: Sharp Kabushiki Kaisha, Osaka, Japan

[21] Appl. No.: 446,069

[22] Filed: Dec. 5, 1989

Related U.S. Application Data

[63] Continuation of Ser. No. 267,311, Nov. 4, 1988, abandoned.

[30] Foreign Application Priority Data

Nov. 5, 1987 [JP] Japan .................... 62-279679

[51] Int. Cl.$^5$ .................................. H01L 21/266
[52] U.S. Cl. ................................ 437/28; 437/29; 250/492.2
[58] Field of Search ............... 437/28, 29, 44; 250/492.21

[56] References Cited

U.S. PATENT DOCUMENTS

| | | | |
|---|---|---|---|
| 4,566,175 | 1/1986 | Smagling et al. | 29/576 B |
| 4,638,551 | 1/1987 | Einthoven | 29/571 |
| 4,728,617 | 3/1988 | Woo et al. | 437/30 |
| 4,755,479 | 7/1988 | Miura | 437/157 |
| 4,818,714 | 4/1989 | Haskell | 437/34 |

Primary Examiner—Olik Chaudhuri
Assistant Examiner—G. Fourson
Attorney, Agent, or Firm—Morrison & Foerster

[57] ABSTRACT

An ion-implantation method for implanting desired impurities selectively in a solid material is provided that comprises forming a blocking film on the solid material, and implanting the impurities in the solid material with the blocking film used as a shielding mask for ion implantation, wherein the blocking film is formed to have a gentle slope at its edge portions.

9 Claims, 6 Drawing Sheets

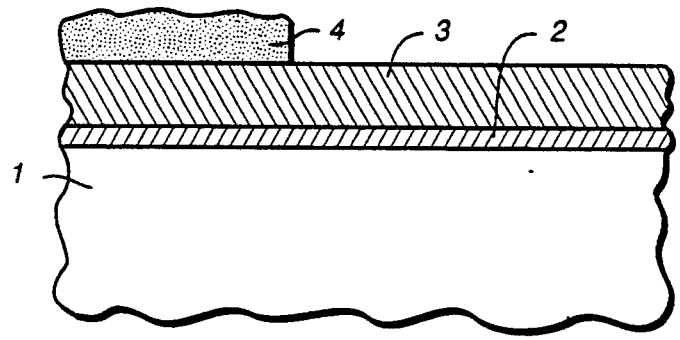
FIG._1A
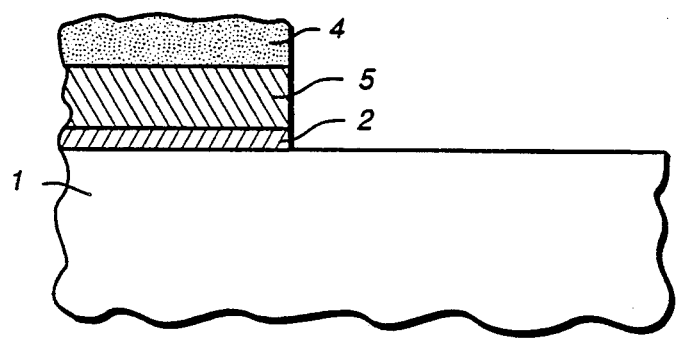
FIG._1B
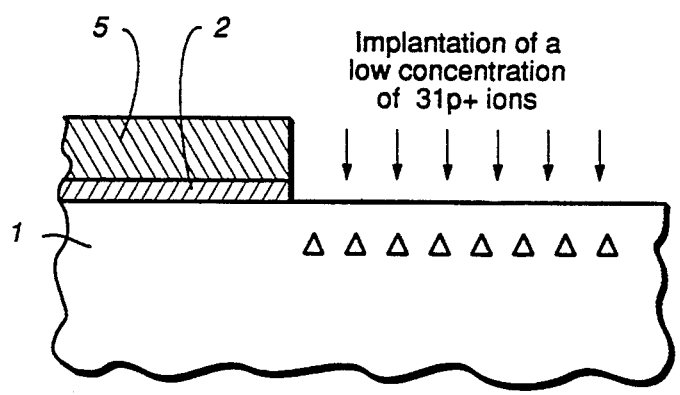
FIG._1C
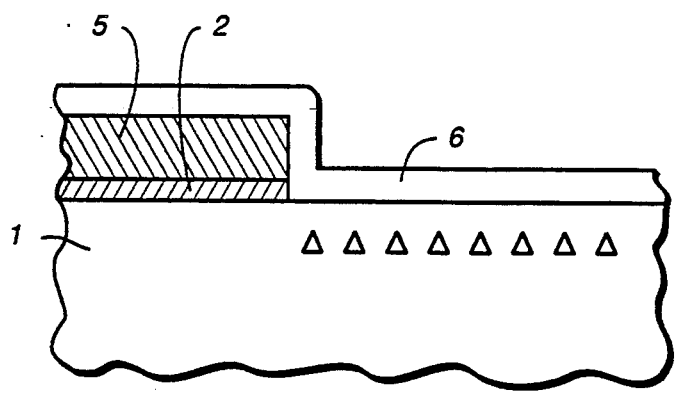
FIG._1D

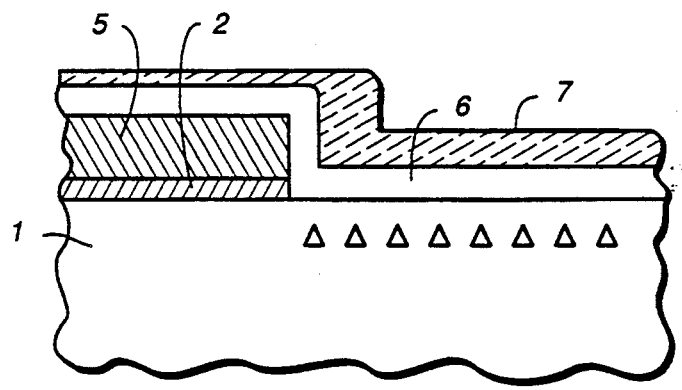
FIG._1E
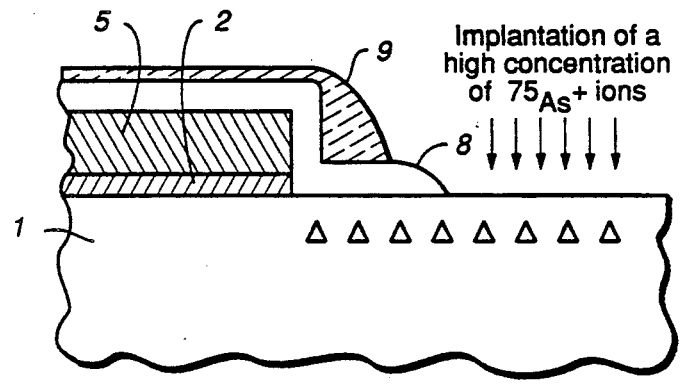
FIG._1F
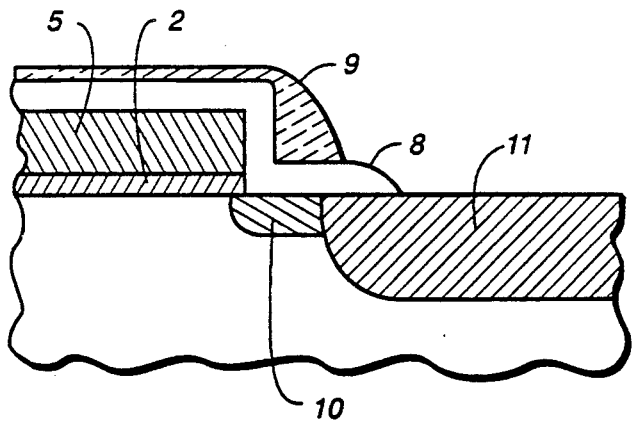
FIG._1G
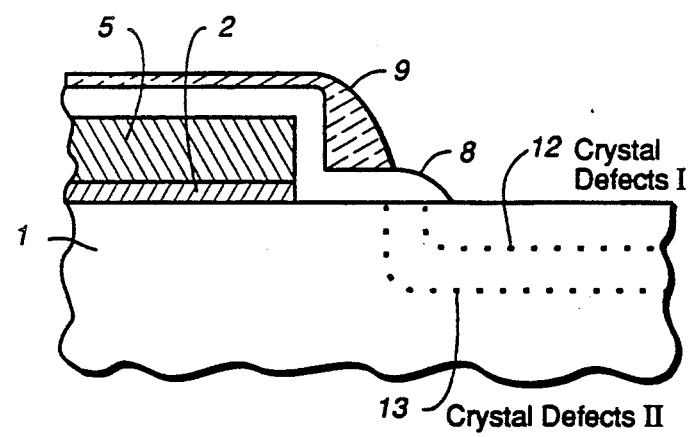
FIG._1H

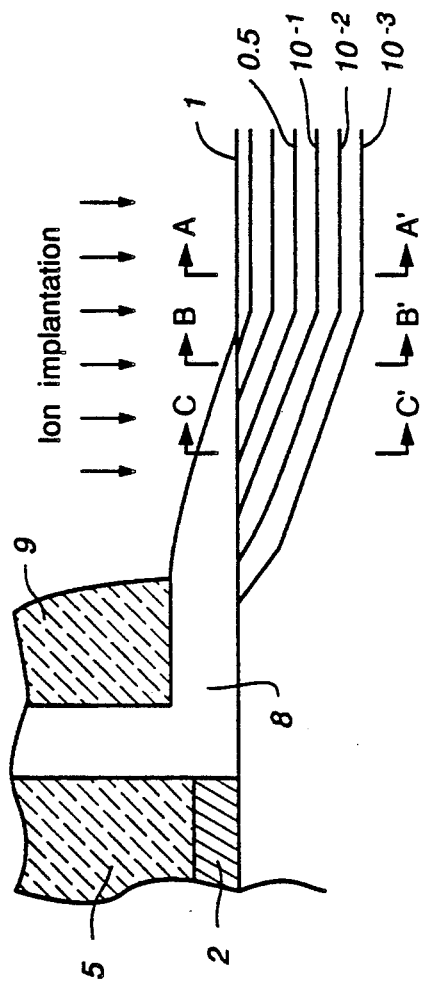
FIG._2A
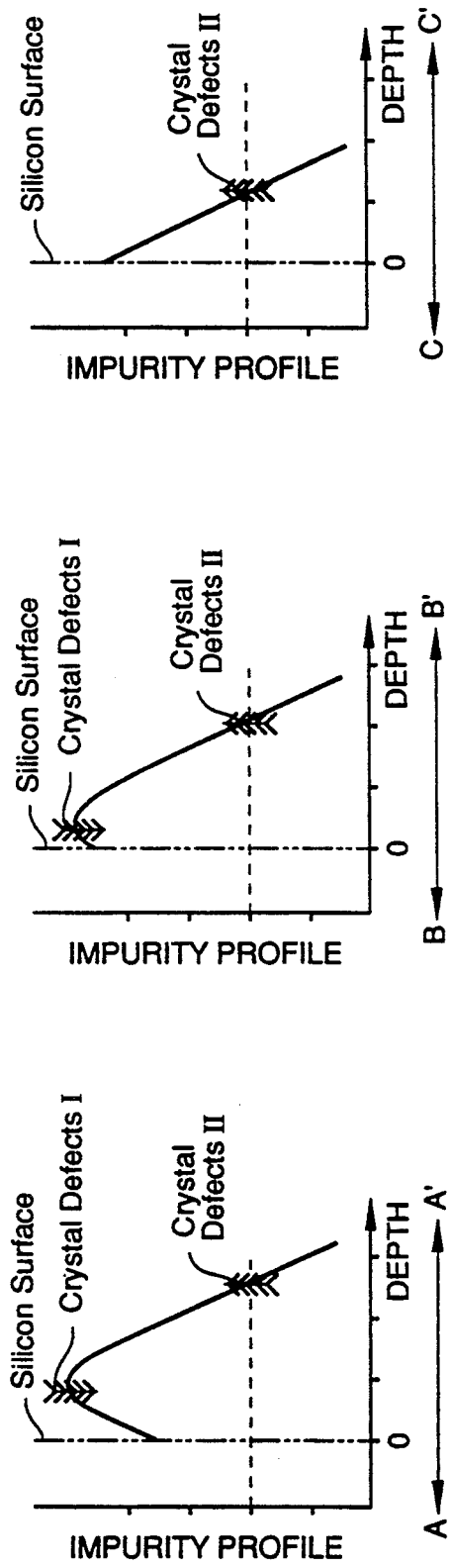
FIG._2B
FIG._2C
FIG._2D

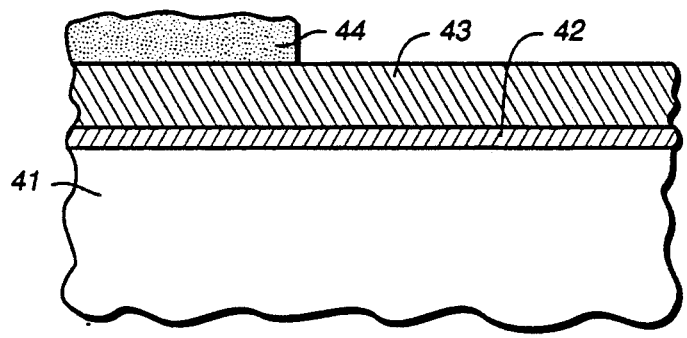
FIG._3A
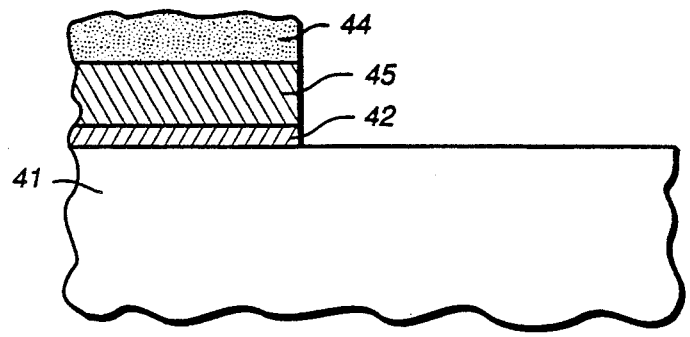
FIG._3B
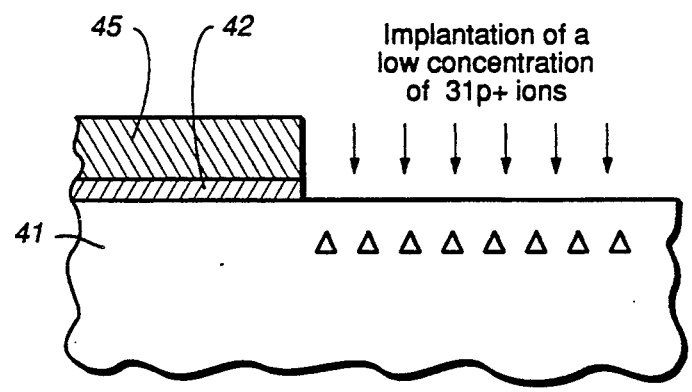
FIG._3C
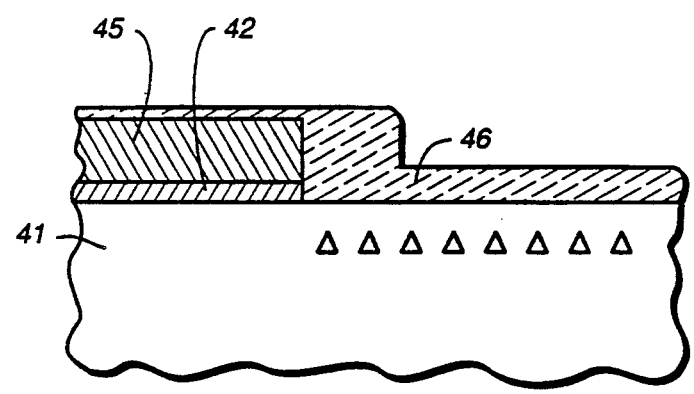
FIG._3D

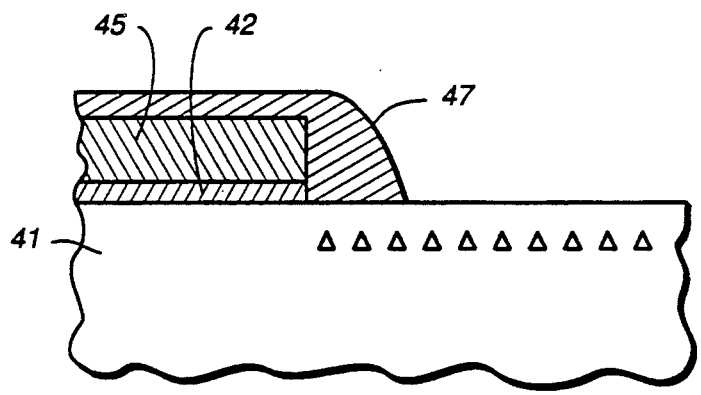
FIG._3E
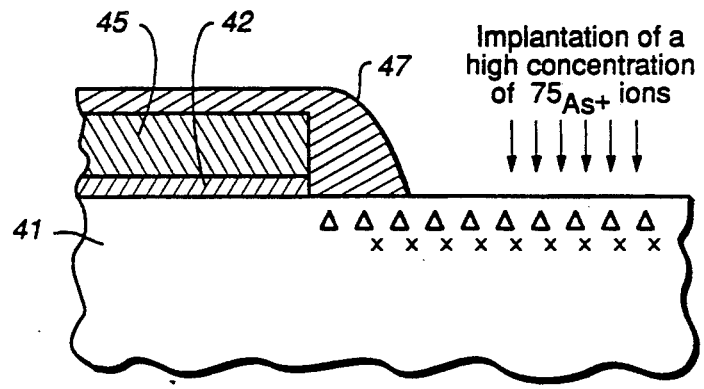
FIG._3F
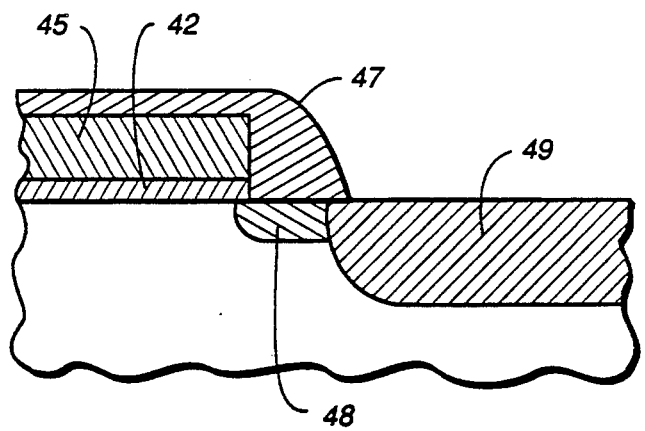
FIG._3G
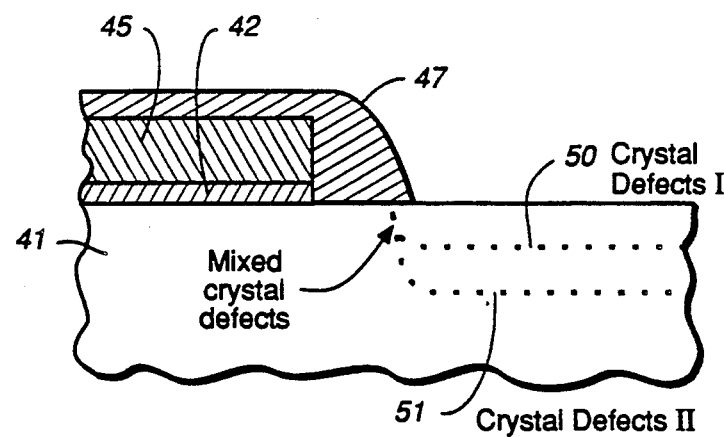
FIG._3H

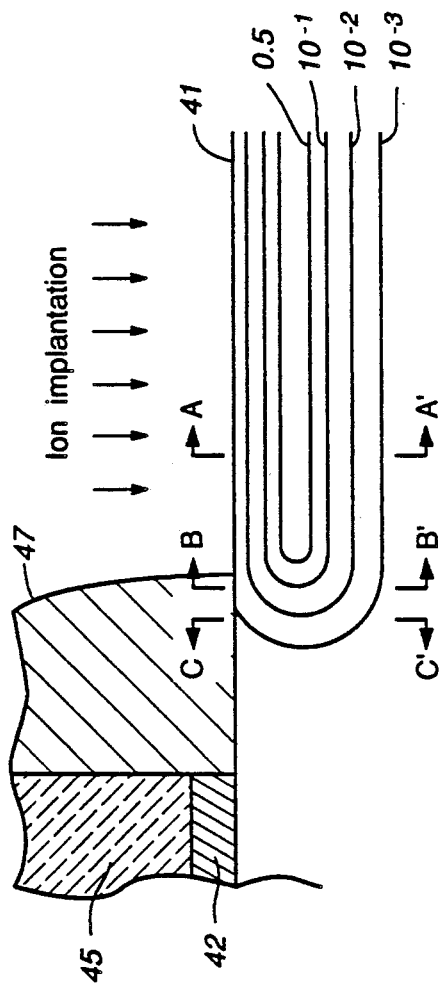
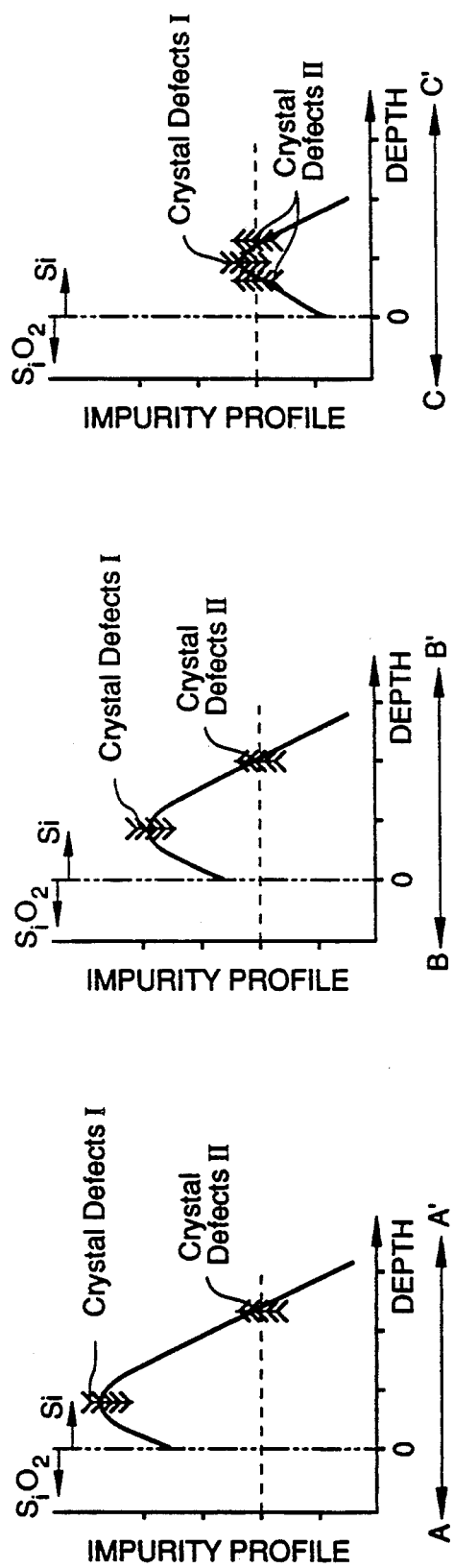
FIG._4A
FIG._4B
FIG._4C
FIG._4D

ION-IMPLANTATION METHOD IN SOLID MATERIALS FOR IMPLANTING IMPURITIES

This is a continuation of copending U.S. patent application Ser. No. 7/267,311, filed 4 Nov. 1988, now abandoned.

BACKGROUND OF THE INVENTION

1. Field of the Invention

This invention relates to an ion-implantation method for implanting impurities in solid materials, and more particularly, to an ion-implantation method for implanting ionized impurities in semiconductor substrates that is suitable for the manufacture of insulated-gate field-effect semiconductor devices.

2. Description of the Prior Art

With the miniaturization of semiconductor devices such as integrated circuits, an ion-implantation method by which atom impurities are introduced uniformly into the semiconductor crystals is a very important process during the manufacture of, for example, VLSI. In particular, this method is essential to the step in which a gate oxide film is formed to have a side wall so that a lightly doped drain (LDD) structure is constructed, and the method is widely used.

FIG. 3 shows fragmentary sectional views of a MOS transistor with an ordinary LDD structure. The MOS transistor is produced as follows: (a) first, by use of an ordinary method for the manufacture of MOS transistors, a gate oxide film 42 is formed by thermal oxidation on a P-type silicon substrate 41, and a gate electrode film 43 is formed on the gate oxide film 42. Next, a photoresist layer is formed over the entire surface, and by photolithography, a photoresist pattern 44 for use in the formation of a gate electrode is formed as shown in FIG. 3a; (b) the photoresist pattern 44 is used as a mask, and the gate electrode film 43 and the gate oxide film 42 are etched in this order, (c) after the photoresist pattern 44 has been removed, the resulting gate electrode 45 and the gate oxide film 42 are used as a shielding mask, $^{31}P^+$ ions (shown by the "Δ" marks in FIG. 3c) are implanted in the P-type silicon substrate 41, resulting in a low-concentration region of the LDD structure; (d) an insulating film 46 is formed over the entire surface; (e) next, anisotropic etching is conducted of the insulating film 46, and a blocking film is formed to have a side wall 47 on the gate electrode 45; (f) in this situation, $^{75}As^+$ ions (shown by the "x" marks in FIG. 3f) are implanted in the P-type silicon substrate 41, resulting in a high-concentration region of the LDD structure; (g) thereafter, by annealing of the ion-implanted layer, a low-concentration region of impurities (n$^-$-part 48) and a high-concentration region of impurities (n$^+$-part 49) are formed, which results in a device with an LDD structure.

However, when the regions with impurities are formed by the conventional ion-implantation method of this type, as shown in FIG. 3h, crystal defects 50 and 51 are concentrated under the edge of the blocking film that is used as a shielding mask for ion implantation. In fact, vertical sections of the substrate were observed by transmission electron microscopy, and it was found that when crystal defects occur deep in the substrate, the crystal defects cannot be removed by a later step of annealing. Therefore, leakage current and other problems can arise, and cause difficulties in the functioning of the device.

The causes of the concentration of crystal defects under the edge of the blocking film as described above are not clearly known yet, but the main causes may include the following:

One is that because the blocking film is formed on a side wall of the gate electrode for an LDD structure, the stress of this blocking film is concentrated on the edges of the source side and the drain side, which may give rise to crystal defects.

Another possibility is that as shown in FIG. 3h, the crystal defects 50 and 51, which are caused by ion-implantation damage, are mixed with each other at the edges of the source side and the drain side. As shown in FIG. 4a, when ion implantation is conducted with an oxide film (side wall 47) used as a shielding mask, the distribution of the implanted impurities can be adequately approximated by the Gaussian distribution. The line A–A' in FIG. 4a shows a selected ordinary ion-implanted layer; a model of the impurity profile on the vertical section at different depths is shown in FIG. 4b.

Next, line B–B' shows a selected ion-implanted layer just below the edge of the blocking film for ion implantation, and a model of the impurity profile on the vertical section at different depths is shown in FIG. 4c.

In the same way, line C–C' shows a selected ion-implanted layer that is further inside the blocking film for ion implantation than line B–B'; a model of the impurity profile on the vertical section at depths is shown in FIG. 4d.

As shown in FIG. 4b, the impurity profile on the vertical section taken along line A–A' of FIG. 4a can be adequately approximated by a model in which the concentration distribution of implanted impurities has a peak at several hundreds of angstroms or several thousands of angstroms from the surface of the semiconductor substrate and a gentle gradient toward the inside of the substrate. The impurity concentration profile on the vertical section taken along line A–A' shows that there are impurities implanted in the semiconductor substrate with the distribution shown in FIG. 4b.

With ion implantation, the accelerated ions collide with the atoms and electrons of the semiconductor crystal, and lose their energy, so that they become stationary in the semiconductor crystal. Therefore, the semiconductor crystal has the most irregularities of its crystal structure in the region around the crystal defects I of FIG. 4b. Moreover, there are large numbers of impurities in this region that cannot make a solid solution, and this may give rise to crystal defects that are very difficult to remove by later heat treatment.

The crystal defects II in FIG. 4b are near the interface between the crystalline region and the amorphous region of the semiconductor substrate. At this area, the distortion and/or lattice mismatching in the semiconductor substrate, which is caused by ion-implantation damage, have become a nucleus, and during a later step of annealing, this nucleus may give rise to large crystal defects such as dislocations and the like. When a high concentration of ions ($10^{15}$/cm$^2$ or more) is implanted in the semiconductor substrate so that a source region and a drain region can be formed, there can exist together both point defects, which do not constitute a continuous amorphous region, and island-like amorphous regions in the areas near the crystal defects II. Also, there seem to be crystal defects that are usually difficult to remove by later heat treatment.

The inventors of this invention found the occurrence of these kinds of crystal defects through observations by transmission electron microscopy. These crystal defects appear, as shown in FIG. 3h, at a position 50 (crystal defects I) reached by the implanted impurities and also at a position 51 (crystal defects II) that is about twice as deep.

In FIG. 4c and 4d, as explained above in detail, in order to discuss the distribution of the implanted impurities under the edge of the blocking film, the impurity profile on the vertical section taken along B-B' of FIG. 4a and the impurity profile on the vertical section taken along line C-C' of FIG. 4a are expressed in terms of a very simple model (in practice, it is necessary to consider a number of factors, such as the shape of the ion beam, the density of the ion beam, the dose-rate effect, and the radiation enhancement diffusion (RED), but these factors are not considered herein). As can be seen from FIG. 4c, in the distribution under the edge of the blocking film (the impurity profile on the vertical section taken along line B-B'), crystal defects I and II are closer to each other than in the usual distribution of FIG. 4b (the impurity profile on the vertical section taken along line A-A'). Also, in FIG. 4d (the impurity profile on the vertical section taken along line C-C'), the crystal defects I and II can be seen to be close enough to overlap with each other. This suggests that the crystal defects that are caused by ion-implantation damage will be mixed with each other inside the semiconductor substrate crystal at the area just below the edges of the source side and the drain side of the blocking film.

The two points that are explained above can be thought of as being the main causes of the occurrence of crystal defects in the inside of the semiconductor substrate under the edge of the blocking film for ion implantation, the crystal defects that already occurred not being removed by later heat treatment. It should be noted that in the case of a semiconductor substrate in which no impurities are implanted, there are no crystal defects in the areas under the edge of the side wall of the blocking film. Taking this fact into consideration, it seems that crystal defects occur in the areas under the edge of the blocking film because of damage during a step of ion implantation or as a synergistic effect between the ion-implantation damage and the stress generated in the side wall of the blocking film.

SUMMARY OF THE INVENTION

The ion-implantation method for implanting desired impurities selectively in a solid material according to this invention, which overcomes the above-discussed and numerous other disadvantages and deficiencies of the prior art, comprises forming a blocking film on the solid material, and implanting the impurities in the solid material with the blocking film used as a shielding mask for ion implantation, wherein the blocking film is formed to have a gentle slope at its edge portions.

In a preferred embodiment, the solid material is a semiconductor substrate of a first conductivity type and the impurities are ions of a second conductivity type.

In a preferred embodiment, the impurities are implanted in the source and drain regions of a MOS transistor.

Thus, the invention described herein makes possible the objectives of (1) providing an ion-implantation method in which a blocking film formed to have a gentle slope at its edge portions is used as a shielding mask for ion implantation, so that it is possible to control the concentration of ion-implantation damage at the areas under the edge of the blocking film, and so that it is possible to prevent the occurrence of crystal defects that cannot be removed by a later step of annealing; and (2) providing an ion-implantation method by which, without bringing about a large increase in the number of manufacturing steps, and without making it necessary to change the process conditions such as those for ion implantation and later annealing, it is possible to decrease the occurrence of crystal defects that is caused at the edge of the blocking film for ion implantation, so that it is possible to produce a semiconductor device with high reliability.

BRIEF DESCRIPTION OF THE DRAWINGS

This invention may be better understood and its numerous objects and advantages will become apparent to those skilled in the art by reference to the accompanying drawings as follows:

FIG. 1 shows fragmentary sectional views of a semiconductor device with an LDD structure that is produced by use of the ion-implantation method of this invention.

FIG. 2 shows schematic diagrams of an impurity profile after the step of ion implantation by use of the method of this invention.

FIG. 3 shows fragmentary sectional views of a semiconductor device with an LDD structure that is produced by use of the conventional ion-implantation method.

FIG. 4 shows schematic diagrams of an impurity profile after the step of ion implantation by use of the conventional method.

DESCRIPTION OF THE PREFERRED EMBODIMENTS

FIG. 1 shows a MOS transistor of the N-channel type that is constructed by use of the ion-implantation method of this invention. This MOS transistor is produced as follows; (a) first, by use of an ordinary method for the manufacture of MOS transistors, a gate oxide film 2 is formed by thermal oxidation on a P-type silicon substrate 1, and a gate electrode film 3 is formed on the gate oxide film 2. Next, a photoresist layer is formed over the entire surface, and by photolithography, a photoresist pattern 4 for use in the formation of a gate electrode is formed as shown in FIG. 1a; (b) the photoresist pattern 4 is used as a mask, and the gate electrode film 3 and the gate oxide film 2 are etched in this order; (c) after the photoresist pattern 4 is removed, the resulting gate electrode 5 and the gate oxide film 2 are used as a shielding mask, and $^{31}P^+$ ions (shown by the "Δ" marks in FIG. 1c) are implanted in the P-type silicon substrate 1, resulting in a low-concentration region of the LDD structure; (d) thereafter, heat treatment is conducted in an oxidative atmosphere, and a $SiO_2$ film 6 is formed over the entire surface; (e) next, a $SiO_2$ film 7 is formed on the $SiO_2$ film 6 by LPCVD or another method, the $SiO_2$ film 7 having an etching rate larger than that of the $SiO_2$ film 6; (f) in this situation, highly anisotropic etching of $SiO_2$ films is carried out, so that because the etching rate of the $SiO_2$ film 7 is larger than that of the $SiO_2$ film 6, the $SiO_2$ film 6 is exposed at the edge portions of the side wall formed. At the edge of the gate electrode 5, there are formed side walls with a relatively gentle step; namely, the side wall 8 of the $SiO_2$ film 6 and the side wall 9 of the $SiO_2$ film 7. At this time, when the shape of the side walls is formed to some extent, it is possible to change the etching process to isotropic wet etching with HF solution or the like. If isotropic wet etching is conducted, the shape of the side walls can be made still more gently sloping. The SiO$_2$ blocking film formed as described above is used as a shielding mask or as a pre-implantation oxide film, and a high concentration of $^{75}$As+ ions is implanted in the P-type silicon substrate 1; (g) thereafter, by annealing of the ion-implanted layer, a low-concentration region of impurities (n$^-$-part 10) and a high-concentration region of (n+-part 11) are formed, which results in a device with an LDD structure.

As shown in FIG. 2a, when ion implantation is conducted with the gently sloping side wall 8 used as a blocking film, the impurity profiles of the vertical sections taken along lines A–A', B–B', and C–C' of the ion-implanted layer can be adequately approximated by the model shown in FIG. 2. In this model, the impurity profile in the areas under the edge of the blocking film, depending upon the film thickness of the side wall 8 mentioned above, is shifted in parallel to the exposed surface of the substrate. Therefore, ion implantation can be conducted without overlapping of crystal defects I and crystal defects II, so that it is possible to avoid the production of accumulated mixed crystal defects that cannot be removed by a later step of annealing. Also, because the edge portion of the blocking film is gently sloping, it is possible to disperse the accumulated stress along the edge portion of the blocking film.

FIG. 1h is a schematic view showing results observed by transmission electron microscopy of the vertical section at the source and drain regions of the MOS transistor in this example. These results indicate that the ion-implantation method of this invention is useful to prevent the occurrence of crystal defects in the areas under the blocking film for ion implantation.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. An ion-implantation method for implanting desired impurities selectively in a solid material, which comprises forming a blocking film on said solid material, and implanting said impurities in said solid material with said blocking film used as a shielding mask for ion implantation, wherein said blocking film is composed of a first blocking layer with bordering first side walls of decreasing thickness, formed on said solid material, and a second blocking layer with bordering second side walls of decreasing thickness, formed on the portion of said first blocking layer other than said first side walls, said first blocking layer having a smaller etching rate than that of said second blocking layer, and said decreasing thickness of said first side walls providing a gentler slope than said decreasing thickness of said second side walls.

2. An ion-implantation method according to claim 1, wherein said solid material is a semiconductor substrate of a first conductivity type and said impurities are ions of a second conductivity type.

3. An ion-implantation method according to claim 1, wherein said impurities are implanted in at least one of the source and drain regions of a MOS transistor.

4. An ion-implantation method according to claim 1, wherein said first and second blocking layers are silicon oxide.

5. An ion-implantation method according to claim 4, wherein said side walls having a gentle slope are formed by utilizing the difference in etching rate between the first blocking layer and the second blocking layer.

6. A method for the production of a metal-oxide-semiconductor field effect transistor, which method comprises:
   (a) providing a semiconductor substrate of a first conductivity type;
   (b) forming an insulated gate on a portion of said substrate, said insulated gate having an upper surface and opposite sides;
   (c) implanting first impurity ions of a second conductivity type in said substrate at a low concentration enough to form lightly doped source/drain regions with the use of the insulated gate as a shielding mask for ion implantation, whereby at least one of the source and drain regions is formed in said substrate;
   (d) forming a first blocking layer over said substrate including over said upper surface and opposite sides of said insulated gate;
   (e) forming a second blocking layer over said first blocking layer, said second blocking layer having a greater etching rate than that of said first blocking layer;
   (f) anisotropically etching said first and second blocking layers to produce bordering first and second side walls of decreasing thicknesses, respectively, at the edge of said insulated gate, said second blocking layer remaining on the portion of said first blocking layer other than said first side walls, and said decreasing thickness of said first side walls providing a gentler slope than said decreasing thickness of said second side walls; and
   (g) implanting second impurity ions of a second conductivity type in said substrate at a high concentration enough to form highly doped source/drain regions with the use of the insulated gate and the first and second blocking layers as a shielding mask for the ion implantation.

7. A method according to claim 6, wherein said first and second side walls are formed so as to have a curved surface and to take the form of a staircase.

8. A method according to claim 6, wherein the etching rate of said second blocking layer is greater than that of said first blocking layer.

9. A method according to claim 6, wherein said anisotropic etching is followed by isotropic etching of said first and second blocking layers so that said first and second side walls are thus caused to have a still gentler slope.

* * * * *